(12) United States Patent
Fujino et al.

(10) Patent No.: US 10,303,284 B2
(45) Date of Patent: May 28, 2019

(54) TRANSPARENT CONDUCTIVE FILM AND METHOD FOR PRODUCING THE SAME

(71) Applicant: NITTO DENKO CORPORATION, Ibaraki-shi, Osaka (JP)

(72) Inventors: Nozomi Fujino, Ibaraki (JP); Tomotake Nashiki, Ibaraki (JP); Daiki Kato, Ibaraki (JP); Hironobu Machinaga, Ibaraki (JP); Kazuaki Sasa, Ibaraki (JP); Eri Ueda, Ibaraki (JP); Tomoya Matsuda, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 14/914,108

(22) PCT Filed: Apr. 28, 2015

(86) PCT No.: PCT/JP2015/062820
§ 371 (c)(1),
(2) Date: Feb. 24, 2016

(87) PCT Pub. No.: WO2015/166946
PCT Pub. Date: Nov. 5, 2015

(65) Prior Publication Data
US 2017/0038889 A1    Feb. 9, 2017

(30) Foreign Application Priority Data

Apr. 30, 2014  (JP) .................. 2014-093487
Apr. 27, 2015  (JP) .................. 2015-090642

(51) Int. Cl.
*G06F 3/041*   (2006.01)
*C23C 14/35*   (2006.01)
(Continued)

(52) U.S. Cl.
CPC .............. *G06F 3/0416* (2013.01); *B32B 9/00* (2013.01); *C23C 14/024* (2013.01);
(Continued)

(58) Field of Classification Search
None
See application file for complete search history.

(56) References Cited

U.S. PATENT DOCUMENTS 5,180,476 A   1/1993  Ishibashi et al.
6,669,830 B1  12/2003 Inoue et al.
(Continued)

FOREIGN PATENT DOCUMENTS

CN   101226450 A   7/2008
EP   2 514 851 A1  10/2012
(Continued)

OTHER PUBLICATIONS

International Search Report dated Jul. 7, 2015, issued in counterpart International Application No. PCT/JP2015/062820 (2 pages).
(Continued)

*Primary Examiner* — David Sample
(74) *Attorney, Agent, or Firm* — Westerman, Hattori, Daniels & Adrian, LLP

(57) ABSTRACT

There is provided a transparent conductive film achieving low resistance characteristics of a transparent conductive layer. The present invention provides a transparent conductive film including: a polymer film substrate; and a transparent conductive layer formed on at least one surface of the polymer film substrate by means of a sputtering method using a sputtering gas including argon, wherein an existing atomic amount of argon atoms in the transparent conductive layer is 0.24 atomic % or less; an existing atomic amount of hydrogen atoms in the transparent conductive layer is $13 \times 10^{20}$ atoms/cm$^3$ or less; and the transparent conductive
(Continued)

layer has a specific resistance of $1.1 \times 10^{-4}$ Ω·cm or more and $2.8 \times 10^{-4}$ Ω·cm or less.

17 Claims, 3 Drawing Sheets

(51) Int. Cl.
| | |
|---|---|
| G06F 3/045 | (2006.01) |
| H01B 5/14 | (2006.01) |
| G06F 3/044 | (2006.01) |
| C23C 14/08 | (2006.01) |
| C23C 14/58 | (2006.01) |
| B32B 9/00 | (2006.01) |
| C23C 14/02 | (2006.01) |
| C23C 14/56 | (2006.01) |

(52) U.S. Cl.
CPC ............ *C23C 14/086* (2013.01); *C23C 14/35* (2013.01); *C23C 14/564* (2013.01); *C23C 14/5806* (2013.01); *G06F 3/041* (2013.01); *G06F 3/044* (2013.01); *G06F 3/045* (2013.01); *H01B 5/14* (2013.01); *G06F 2203/04103* (2013.01)

(56) References Cited

U.S. PATENT DOCUMENTS

| | | | |
|---|---|---|---|
| 7,294,852 B2* | 11/2007 | Wakairo | C23C 14/086 257/43 |
| 2003/0218153 A1 | 11/2003 | Abe | |
| 2005/0287724 A1* | 12/2005 | Wakairo | C23C 14/086 438/151 |
| 2008/0067508 A1* | 3/2008 | Endo | H01L 21/265 257/43 |
| 2008/0176042 A1 | 7/2008 | Nashiki et al. | |
| 2008/0237034 A1* | 10/2008 | Wakairo | C23C 14/086 204/192.29 |
| 2009/0104440 A1 | 4/2009 | Nashiki et al. | |
| 2010/0269898 A1 | 10/2010 | Takahashi et al. | |
| 2012/0111718 A1 | 5/2012 | Haishi et al. | |
| 2012/0114923 A1 | 5/2012 | Haishi et al. | |
| 2012/0192914 A1* | 8/2012 | Fujishima | H01L 31/02247 136/244 |
| 2013/0048348 A1 | 2/2013 | Yamazaki et al. | |
| 2013/0105301 A1 | 5/2013 | Yamazaki et al. | |
| 2013/0149555 A1 | 6/2013 | Yamazaki et al. | |
| 2013/0288047 A1 | 10/2013 | Kajihara et al. | |
| 2014/0079927 A1 | 3/2014 | Yoshioka et al. | |
| 2014/0102764 A1 | 4/2014 | Fujino et al. | |
| 2014/0141237 A1* | 5/2014 | Takeyasu | G06F 3/044 428/336 |
| 2014/0353140 A1 | 12/2014 | Haishi et al. | |
| 2015/0086789 A1 | 3/2015 | Kajihara et al. | |
| 2015/0300632 A1* | 10/2015 | Kim | F23D 1/02 110/234 |
| 2015/0357076 A1* | 12/2015 | Sasa | C23C 14/34 428/216 |
| 2015/0357077 A1* | 12/2015 | Sasa | C23C 14/34 428/336 |
| 2016/0024640 A1* | 1/2016 | Sasa | C23C 14/086 428/336 |
| 2016/0160345 A1* | 6/2016 | Miyamoto | B32B 7/02 428/412 |
| 2017/0043554 A1* | 2/2017 | Fujino | B32B 7/02 |
| 2017/0045645 A1* | 2/2017 | Fujino | B32B 9/00 |
| 2017/0051398 A1* | 2/2017 | Fujino | B32B 9/00 |

FOREIGN PATENT DOCUMENTS

| | | |
|---|---|---|
| JP | H03-249171 A | 11/1991 |
| JP | 10-173391 A | 6/1998 |
| JP | 10-190028 A | 7/1998 |
| JP | 2002-371350 A | 12/2002 |
| JP | 2002-371355 A | 12/2002 |
| JP | 2003-132738 A | 5/2003 |
| JP | 2004-6221 A | 1/2004 |
| JP | 2006-152322 A | 6/2006 |
| JP | 2007-23304 A | 2/2007 |
| JP | 2007-95660 A | 4/2007 |
| JP | 2009-104842 A | 5/2009 |
| JP | 2009-143026 A | 7/2009 |
| JP | 2009-187687 A | 8/2009 |
| JP | 2011-18623 A | 1/2011 |
| JP | 2011-127151 A | 6/2011 |
| JP | 2011-190542 A | 9/2011 |
| JP | 2012-112031 A | 6/2012 |
| JP | 2012-134085 A | 7/2012 |
| JP | 2012-199215 A | 10/2012 |
| JP | 2013-1009 A | 1/2013 |
| JP | 2013-43372 A | 3/2013 |
| TW | 201305698 A1 | 2/2013 |
| WO | 2009/044898 A1 | 4/2009 |
| WO | 2009/084527 A1 | 7/2009 |
| WO | 2012/161095 A1 | 11/2012 |
| WO | 2013/080995 A1 | 6/2013 |
| WO | 2013/172354 A1 | 11/2013 |
| WO | 2013/183564 A1 | 12/2013 |
| WO | 2014/024819 A1 | 2/2014 |
| WO | 2014/115770 A1 | 7/2014 |

OTHER PUBLICATIONS

Office Action and Search Report dated Dec. 16, 2015, issued in counterpart Taiwanese application No. 104113966, w/ English translation (12 pages).
Office Action dated Apr. 12, 2016, issued in counterpart Japanese Patent Application No. 2015-091660, with English translation. (11 pages).
Office Action dated May 26, 2016, issued in counterpart Taiwanese Patent Application No. 104113967, with English translation. (14 pages).
Office Action dated Sep. 2, 2016, issued in counterpart Japanese Patent Application No. 2015-091660, with English translation. (8 pages).
Notification of Transmittal of Translation of the International Preliminary Report on Patentability (Form PCT/IB/338) issued in counterpart International Application No. PCT/JP2015/062820 dated Nov. 10, 2016, with Forms PCT/IB/373 and PCT/ISA/237. (16 pages).
"Major Plastics—Features and Use", Japan Plastics Industry Federation, Http://www.jpif.gr.jp/2 hello/conts/youto_c.htm; with English translation. (2 pages).
Office Action dated Apr. 4, 2017, issued in counterpart Japanese Application No. 2015-090642, with machine translation. (20 pages).
Office Action dated Dec. 16, 2016, issued in Taiwanese Application No. 104113967, with English translation. (10 pages).
Office Action dated May 28, 2018, issued in Chinese application No. 201580001716.6, with English translation. (18 pages).
Office Action dated Jun. 28, 3018, issued in Chinese application No. 201580022929.7, with English translation. (18 pages).
Office Action dated Jan. 22, 2019, issued in counterpart Chinese application No. 201580001716.6, with English translation. (15 pages).
Office Action dated Nov. 29, 2018, issued in counterpart Japanese application No. 2016-233936, with English translation. (8 pages).

* cited by examiner

TRANSPARENT CONDUCTIVE FILM AND METHOD FOR PRODUCING THE SAME

TECHNICAL FIELD

The present invention relates to a transparent conductive film and a method for producing the same.

BACKGROUND ART

A conventionally well-known transparent conductive film is so-called conductive glass which includes a glass substrate and an ITO film (indium-tin composite oxide film) formed thereon. On the other hand, the glass substrate has low flexibility and workability, and cannot be used in some applications. In recent years, therefore, transparent conductive films having an ITO film formed on various polymer film substrates such as polyethylene terephthalate films have been proposed because of their advantages such as excellent flexibility, workability, and impact resistance, as well as light weight.

Characteristics such as high transparency, high transmission, and high durability have been demanded for a transparent conductive material represented by a touch panel. During sputtering film deposition of a transparent thin film, sputtering performed so that the amount of atoms included in a sputtering gas in the thin film is 0.05 atomic % or less is known as a measure for improving transmittance (see Patent Document 1).

In addition, decreases in a specific resistance value and a surface resistance value are increasingly required for the ITO film formed on the polymer film substrate for high sensitivity (improvement in operability) and low power consumption in order to correspond to an increase in touch screen panel. A technique for forming an ITO film on a film substrate by means of a magnetron sputtering method setting a horizontal magnetic field on a target material to 50 mT or more has been proposed as a measure for providing a transparent conductive film having excellent light transparency and low specific resistance (see Patent Document 2).

PRIOR ART DOCUMENT

Patent Documents

Patent Document 1: JP-A-2002-371355
Patent Document 2: WO 2013/080995

SUMMARY OF THE INVENTION

Problems to be Solved by the Invention

Even the above technique provides sufficiently low specific resistance depending on applications, but the present inventors have advanced consideration of further decrease in specific resistance from the viewpoint of the development of a next-generation transparent conductive film. Then, approaches have been tried from both the formation process and composition of the ITO film.

FIG. 3 is a conceptual view schematically showing a process of forming an ITO film by sputtering. A sputtering gas (including oxygen if necessary) introduced into a sputtering chamber and mainly including argon collides with electrons generated by a potential difference between an ITO target 13 and a roller 52 for transporting a film substrate, and is ionized to generate plasma 5. Ions thus generated (particularly, argon ions 4) collide with the target 13, and target particles 2' sputtered are deposited on a polymer film substrate 1 to form a transparent conductive layer 2.

In this case, parts of the ions colliding with the target 13 recoil from the target 13, move toward the side of the substrate 1, and may be incorporated as argon atoms 4' into the transparent conductive layer 2. In addition to the argon atoms, moisture and organic components included in the polymer film substrate 1, or hydrogen atoms 6 derived from moisture or the like in a sputtering atmosphere may be incorporated into the transparent conductive layer 2.

The present inventors have studied repeatedly based on the following prediction that the argon atoms, the hydrogen atoms and the like incorporated into the transparent conductive layer act as impurities, and affect resistance characteristics.

It is an object of the present invention to provide a transparent conductive film achieving low resistance characteristics of a transparent conductive layer.

Means for Solving the Problems

As a result of earnest study to achieve the object, the present inventors have accomplished the invention based on novel technical findings that the object can be achieved by controlling a specific correlativity existing between impurities included in a transparent conductive layer and a resistance value.

Specifically, the present invention relates to a transparent conductive film including:

a polymer film substrate; and a transparent conductive layer formed on at least one surface of the polymer film substrate by means of a sputtering method using a sputtering gas including argon, wherein an existing atomic amount of argon atoms in the transparent conductive layer is 0.24 atomic % or less;

an existing atomic amount of hydrogen atoms in the transparent conductive layer is $13 \times 10^{20}$ atoms/cm$^3$ or less; and the transparent conductive layer has a specific resistance of $1.1 \times 10^{-4}$ Ω·cm or more and $2.8 \times 10^{-4}$ Ω·cm or less.

In the transparent conductive film, the existing atomic amount (hereinafter, merely also referred to as an "existing amount") of the argon atoms in the transparent conductive layer formed by means of the sputtering method is set to 0.24 atomic % or less, and the existing amount of the hydrogen atoms is set to an extremely low value of $13 \times 10^{20}$ atoms/cm$^3$ or less, so that the low resistance of the transparent conductive layer can be achieved efficiently. The reason for this is not limited by any theory, but it will be inferred as follows. The argon atoms and hydrogen atoms incorporated into the transparent conductive layer in the sputtering step act as impurities. The resistance characteristics of the transparent conductive layer depends on a carrier density and mobility peculiar to a material, but generally, impurities in the transparent conductive layer cause inhibition of crystal growth and decrease in mobility due to neutron scattering. This is therefore considered to increase the resistance value of the transparent conductive layer when the existing amount of each of the argon atoms and hydrogen atoms incorporated into the transparent conductive layer is increased. In the transparent conductive film, the existing amount of each of the argon atoms and hydrogen atoms in the transparent conductive layer is suppressed low, so that the mobility of the transparent conductive layer can be increased. This can effectively achieve the low resistance of the transparent conductive layer.

If the existing amount of the argon atoms in the transparent conductive layer is more than 0.24 atomic % or the existing atomic amount of the hydrogen atoms is more than $13 \times 10^{20}$ atoms/cm$^3$, the argon atoms or the hydrogen atoms largely act as impurities. This may cause carrier scattering and crystal growth inhibition, to thereby decrease the mobility of the transparent conductive layer.

In the transparent conductive film, the existing amount of each of the argon atoms and hydrogen atoms in the transparent conductive layer is suppressed to an extremely low amount, so that the specific resistance of the transparent conductive layer can be decreased to the range of $1.1 \times 10^{-4}$ $\Omega \cdot cm$ or more and $2.8 \times 10^{-4}$ $\Omega \cdot cm$ or less, and the resistance of the transparent conductive film can be made low.

An existing atomic amount of carbon atoms in the transparent conductive layer is preferably $10.5 \times 10^{20}$ atoms/cm$^3$ or less. During sputtering, the carbon atoms derived from an organic component mainly included in the polymer film substrate may be incorporated into the transparent conductive layer. The carbon atoms in the transparent conductive layer also act as impurities as in the argon atoms and the hydrogen atoms. By suppressing the existing amount of the carbon atoms in the transparent conductive layer low, the mobility of the transparent conductive layer can be increased. This can efficiently achieve the low resistance of the transparent conductive layer.

The transparent conductive layer is preferably an indium-tin composite oxide layer. When the transparent conductive layer is an indium-tin composite oxide (hereinafter, also referred to as "ITO") layer, a transparent conductive layer having lower resistance can be formed.

The transparent conductive layer is preferably crystalline. When the transparent conductive layer is crystalline, advantages are provided such that transparency is improved, a change in resistance after a humidification-heating test is small, and humidification-heating reliability is improved.

A content of tin oxide in the indium-tin composite oxide layer is preferably 0.5% by weight to 15% by weight based on a total amount of tin oxide and indium oxide. This can increase a carrier density to advance lower specific resistance. The content of tin oxide can be appropriately selected in the above range according to the specific resistance of the transparent conductive layer.

It is preferable that the transparent conductive layer has a structure where a plurality of indium-tin composite oxide layers are laminated, and that at least two layers of the plurality of indium-tin composite oxide layers have different existing amounts of tin from each other. Not only the existing amount of each of the argon atoms and hydrogen atoms in the transparent conductive layer but also such a specific layer structure of the transparent conductive layer can advance the shortening of a crystal conversion time and the lower resistance of the transparent conductive layer.

All of the indium-tin composite oxide layers are preferably crystalline. When all of the indium-tin composite oxide layers are crystalline, advantages are provided such that the transparency of the transparent conductive film is improved, a change in resistance after a humidification-heating test is small, and humidification-heating reliability is improved.

In one embodiment of the present invention, it is preferable that the transparent conductive layer includes a first indium-tin composite oxide layer and a second indium-tin composite oxide layer in this order from a side of the polymer film substrate; a content of tin oxide in the first indium-tin composite oxide layer is 6% by weight to 15% by weight based on a total amount of tin oxide and indium oxide; and a content of tin oxide in the second indium-tin composite oxide layer is 0.5% by weight to 5.5% by weight based on the total amount of tin oxide and indium oxide. The above two-layered structure can achieve the low specific resistance of the transparent conductive layer and the shortening of the crystal conversion time.

In one embodiment of the present invention, the transparent conductive film includes an organic undercoat layer formed by means of a wet coating method between the polymer film substrate and the transparent conductive layer. Therefore, a surface of the polymer film substrate tends to be smoothed, and thus, the ITO film formed on the smoothed polymer film substrate tends to be also smoothed. As a result, this can contribute to the low resistance of the ITO film. When the transparent conductive film includes the organic undercoat layer, the reflectance of the transparent conductive film is easily adjusted, so that optical characteristics can also be improved.

In one embodiment of the present invention, the transparent conductive film includes an inorganic undercoat layer formed by means of a vacuum film deposition method between the polymer film substrate and the transparent conductive layer. When the inorganic undercoat layer is interposed between the polymer film substrate and the transparent conductive layer, it is possible to block the incorporation of the moisture of the polymer film substrate as well as the hydrogen atoms and carbon atoms derived from the organic component into the transparent conductive layer. This can more efficiently advance the low specific resistance of the transparent conductive layer.

In one embodiment of the present invention, the transparent conductive film includes:

an organic undercoat layer formed by means of a wet coating method, an inorganic undercoat layer formed by means of a vacuum film deposition method, and the transparent conductive layer in this order on at least one surface of the polymer film.

The present invention also relates to a method for producing the transparent conductive film, the method including:

a step A of placing a polymer film substrate under a vacuum condition having an ultimate vacuum degree of $3.5 \times 10^{-4}$ Pa or less; and a step B of forming a transparent conductive layer on at least one surface of the polymer film substrate by means of a sputtering method with a discharge voltage of 100 V or more and 400 V or less using a sputtering gas including argon.

The production method includes the step A of evacuating the polymer film substrate to a predetermined ultimate vacuum degree, so that the amount of moisture or organic component in the polymer film substrate or sputtering atmosphere can be decreased, and accordingly the amount of the hydrogen atoms incorporated into the transparent conductive layer can be decreased.

Furthermore in the production method, the discharge voltage during sputtering is set to a low value of 100 V or more and 400 V or less. This can decrease the reaching frequency of argon ions recoiling from a target to the polymer film substrate. As a result, the amount of the argon atoms incorporated into the transparent conductive layer can be decreased. The reason for this is not exactly known, but it is inferred as follows. When argon which serves as a sputtering gas is ionized and collides with the target, the kinetic energy thereof depends on the discharge voltage during sputtering. Since the kinetic energy of the argon ions is also decreased by decreasing the discharge voltage, the argon ions recoiling from the target can no longer hold the kinetic energy for reaching the polymer film substrate. As a result, the amount of the argon atoms incorporated into the transparent conductive layer is considered to be decreased.

The production method achieves the suppression of the incorporation of the hydrogen atoms into the transparent conductive layer by adopting the step A, and also the suppression of the incorporation of the argon atoms into the transparent conductive layer by adopting the step B, so that a transparent conductive layer having low resistance characteristics can be efficiently formed.

The sputtering method is preferably an RF superimposed DC sputtering method. The RE superimposed DC sputtering method combining a DC power source with an RF power source can more efficiently decrease the discharge voltage.

A horizontal magnetic field at a surface of a sputtering target is preferably 20 mT or more and 200 mT or less in the step B. By applying a comparatively high magnetic field to the surface of the target during sputtering, generated plasma remains near the surface of the target by being subjected to the effect of the magnetic field. This provides an increase in a plasma density near the surface of the target, so that the collision frequency of the sputtering gas to the target can be increased. As a result, even at a low discharge voltage, the ITO film can be efficiently sputter-deposited.

The production method preferably includes a step of heating the transparent conductive layer to subject the transparent conductive layer to crystal conversion. When the transparent conductive layer is crystalline, advantages are provided such that transparency is improved, a change in resistance after a humidification-heating test is small, and humidification-heating reliability is improved.

In one embodiment, the production method may include a step of forming, before the step B, an inorganic undercoat layer by means of a vacuum film deposition method on a surface of the polymer film substrate on which the transparent conductive layer is formed. When the inorganic undercoat layer is interposed between the polymer film substrate and the transparent conductive layer, it is possible to block the incorporation of the moisture of the polymer film substrate as well as the hydrogen atoms and carbon atoms derived from the organic component into the transparent conductive layer. This can more efficiently advance the low specific resistance of the transparent conductive layer.

MODE FOR CARRYING OUT THE INVENTION

An embodiment of a transparent conductive film according to the present invention will be described below with reference to the drawings. However, in a part or whole of the drawings, some elements unnecessary for description are in some cases not drawn, and some elements may be illustrated by being enlarged or diminished for the sake of facilitating the description. The terms each denoting a positional relationship such as "upper" and "lower" are used merely for the sake of facilitating the description unless otherwise specified, and are not intended to limit the constitution of the present invention at all.

[Transparent Conductive Film]

Figure 1:
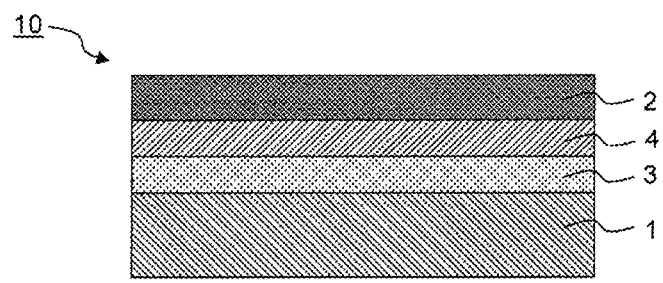
FIG. 1 is a schematic sectional view of a transparent conductive film according to one embodiment of the present invention.

As shown in FIG. 1, in a transparent conductive film 10, a transparent conductive layer 2 is formed on one surface of a polymer film substrate 1. The transparent conductive layer may be formed on each of both surfaces of the substrate 1. One or two or more undercoat layers may be provided between the polymer film substrate 1 and the transparent conductive layer 2. In the aspect shown in FIG. 1, undercoat layers 3 and 4 are formed from the side of the polymer film substrate 1.

<Polymer Film Substrate>

The polymer film substrate 1 has strength necessary for ease of handling, and has transparency in the visible light region. A film having excellent transparency, heat resistance, and surface smoothness is preferably used as the polymer film substrate. Examples of the material for such a film include polyesters including polyethylene terephthalate and polyethylene naphthalate, polyolefin, polycycloolefin, polycarbonate, polyether sulfone, polyarylate, polyimide, polyamide, polystyrene, homopolymers of norbornene and copolymers of norbornene with other components. Among them, a polyester resin is suitably used because it has excellent transparency, heat resistance, and mechanical characteristics. Polyethylene terephthalate (PET) and polyethylene naphthalate (PEN) or the like are particularly suitable as the polyester resin. From the viewpoint of strength, the polymer film substrate is preferably subjected to a stretching treatment, and the polymer film substrate is more preferably subjected to a biaxial stretching treatment. The stretching treatment is not particularly limited, and a known stretching treatment can be adopted.

Although the thickness of the polymer film substrate is not particularly limited, it is preferably in a range of 2 to 200 µm, more preferably in a range of 2 to 150 µm, and still more preferably in a range of 20 to 150 µm. If the thickness of the film is less than 2 µm, the mechanical strength of the polymer film substrate may be insufficient and the operation of successively forming the transparent conductive layer 2 by making the film into a roll may be difficult. On the other hand, if the thickness of the film is more than 200 µm, the scratch resistance of the transparent conductive layer 2 and a tap characteristic for a touch panel may not be improved.

The surface of the substrate may be previously subjected to sputtering, corona discharge treatment, flame treatment, ultraviolet irradiation, electron beam irradiation, chemical treatment, etching treatment such as oxidation, or undercoating treatment so that the tackiness of the substrate to the transparent conductive layer 2 formed on the substrate can be improved. If necessary, before the transparent conductive layer is formed, the surface of the substrate may also be subjected to dust removing or cleaning by solvent cleaning, ultrasonic cleaning or the like.

The polymer film as the substrate 1 is provided in the form of a roll in which a long film is wound, and the transparent conductive layer 2 is continuously formed thereon by a roll-to-roll method to give a long transparent conductive film.

<Transparent Conductive Layer>

The transparent conductive layer 2 is formed on at least one surface of the polymer film substrate 1 by means of a sputtering method using a sputtering gas including argon.

The existing atomic amount of argon atoms in the transparent conductive layer 2 should be 0.24 atomic % or less. Furthermore, the upper limit of the existing amount of the argon atoms is preferably 0.23 atomic % or less, more preferably 0.20 atomic % or less, and still more preferably 0.18 atomic % or less. Although the lower limit of the existing concentration of the argon atoms is preferably lower, it is preferably more than 0.05 atomic %, and more preferably 0.06 atomic % or more. If the existing amount of the argon atoms in the transparent conductive layer is too large, the argon atoms may largely act as impurities, and this may cause carrier scattering and crystal growth inhibition, to thereby decrease the mobility of the transparent conductive layer. On the other hand, if the existing amount of the argon atoms is too small, this largely contributes to the low resistance of the transparent conductive layer but causes an excessive increase in the crystal grain size of the transparent conductive layer during crystal conversion. As a result, the flexibility of the transparent conductive layer may be decreased. It is considered that some impurities which may be included in the transparent conductive layer 2 are derived from a formation process of the transparent conductive layer. It is considered that the argon atoms are derived from argon gas for plasma generation of a sputtering method.

A Rutherford backscattering spectroscopic method is adopted as a method for quantitatively determining the argon atoms in the transparent conductive layer as impurities. The principle of the method is as follows. When a sample is irradiated with ions (for example, He ions) at a high speed, a part of the incident ions are subjected to elastic backscattering by an atomic nucleus in the sample. Since the energy of the backscattered ions depends on the mass and position (depth in the sample) of the target atomic nucleus, the relationship between the energy and yield of the scattered ions is obtained by a semiconductor detector. By performing numerical analysis based on the obtained spectrum, information on the elemental composition of the sample in the depth direction can be found out. The measuring method is described in detail in Examples.

When the transparent conductive layer is ITO, the existing atomic amount of Ar can be usually calculated with accuracy using In, Sn, and O as a detection target in addition to Ar. When ITO also includes an additional component other than the above components, the additional component may be a detection target.

The existing atomic amount of hydrogen atoms in the transparent conductive layer 2 should be $13 \times 10^{20}$ atoms/cm$^3$ or less. Furthermore, the upper limit of the existing amount of the hydrogen atoms is preferably $12 \times 10^{20}$ atoms/cm$^3$ or less, more preferably $11 \times 10^{20}$ atoms/cm$^3$ or less, and still more preferably $9.5 \times 10^{20}$ atoms/cm$^3$ or less. Although the lower limit of the existing concentration of the hydrogen atoms is preferably lower, it is preferably $0.001 \times 10^{20}$ atoms/cm$^3$ or more, and more preferably $0.05 \times 10^{20}$ atoms/cm$^3$ or more. If the existing amount of the hydrogen atoms in the transparent conductive layer is too large, the hydrogen atoms may largely act as impurities, and this may cause carrier scattering and crystal growth inhibition, to thereby decrease the mobility of the transparent conductive layer. On the other hand, when the existing amount of the hydrogen atoms is too small, this largely contributes to the low resistance of the transparent conductive layer but causes an excessive increase in the crystal grain size of the transparent conductive layer during crystal conversion. As a result, the flexibility of the transparent conductive layer may be decreased. It is considered that the hydrogen atoms as impurities which may be included in the transparent conductive layer are derived from moisture or organic components included in the polymer film substrate, moisture in a sputtering atmosphere, and moisture or organic components included in an undercoat layer when the transparent conductive layer includes the undercoat layer formed of an organic material as a lower layer.

The existing atomic amount of carbon atoms in the transparent conductive layer 2 is preferably $10.5 \times 10^{20}$ atoms/cm$^3$ or less, more preferably $9 \times 10^{20}$ atoms/cm$^3$ or less, and still more preferably $5 \times 10^{20}$ atoms/cm$^3$ or less. Although the lower limit of the existing concentration of the carbon atoms is preferably lower, it is preferably $0.001 \times 10^{20}$ atoms/cm$^3$ or more, and more preferably $0.01 \times 10^{20}$ atoms/cm$^3$ or more. If the existing amount of the carbon atoms in the transparent conductive layer is too large, the carbon atoms may largely act as impurities as in the argon atoms and the hydrogen atoms, and this may cause carrier scattering and crystal growth inhibition, to thereby decrease the mobility of the transparent conductive layer. It is considered that the carbon atoms as impurities which may be included in the transparent conductive layer are derived from organic components included in the polymer film substrate, and organic components included in an undercoat layer when the transparent conductive layer includes the undercoat layer formed of an organic material as a lower layer.

In the quantitative determination of the hydrogen atoms and the carbon atoms in the transparent conductive layer, the amount of impurities in the depth direction can be measured by secondary ion mass spectrometry while the transparent conductive layer is sequentially sputtered from the surface thereof using Cs$^+$ ions (the analysis method is generally referred to as dynamic SIMS). As the amount of impurities included in an ITO layer, there is adopted data of the center point of the ITO film thickness (point of 25 nm when the film thickness of the ITO layer is 50 nm). The carbon atoms and the hydrogen atoms included in the transparent conductive layer can be detected without any influence of the carbon atoms and the hydrogen atoms included in the contamination on the surface of the transparent conductive layer or included in the substrate. The measuring method is described in detail in Examples.

Materials for forming the transparent conductive layer 2 are not particularly limited, and oxides of at least one metal selected from the group consisting of In, Sn, Zn, Ga, Sb, Ti, Si, Zr, Mg, Al, Au, Ag, Cu, Pd, and W are suitably used. Such metal oxides may further include any metal atom selected from the above group, if necessary. For example, an indium-tin composite oxide (ITO), an antimony-tin composite oxide (ATO) or the like is preferably used, and ITO is particularly preferably used.

When ITO (indium-tin composite oxide) is used as the material for forming the transparent conductive layer 2, the content of tin oxide (SnO$_2$) in the metal oxide is preferably 0.5% by weight to 15% by weight, more preferably 3 to 15% by weight, still more preferably 5 to 12% by weight, and particularly preferably 6 to 12% by weight, based on the total amount of tin oxide and indium oxide (In$_2$O$_3$). If the amount of tin oxide is too small, the durability of the ITO film may deteriorate. If the amount of tin oxide is too large, the crystal conversion of the ITO film becomes difficult, and transparency and stability of the resistance value may be insufficient.

The term "ITO" as used herein should be a composite oxide which includes at least indium (In) and tin (Sn), and may include additional components other than indium and tin. Examples of the additional components include metallic elements other than In and Sn. Specific examples thereof include Zn, Ga, Sb, Ti, Si, Zr, Mg, Al, Au, Ag, Cu, Pd, W, Fe, Pb, Ni, Nb, Cr, Ga, and a combination thereof. Although the content of the additional component is not particularly limited, it may be 3% by weight or less.

The transparent conductive layer 2 may have a structure where a plurality of indium-tin composite oxide layers having different existing amounts of tin from each other are laminated. In this case, the number of the ITO layers may be 2 or 3 or more.

When the transparent conductive layer 2 has a two-layered structure where a first indium-tin composite oxide layer and a second indium-tin composite oxide layer are laminated in this order from the side of the polymer film substrate 1, the content of tin oxide in the first indium-tin composite oxide layer is preferably 6% by weight to 15% by weight, more preferably 6 to 12% by weight, and still more preferably 6.5 to 10.5% by weight, based on the total amount of tin oxide and indium oxide. The content of tin oxide in the second indium-tin composite oxide layer is preferably 0.5% by weight to 5.5% by weight, more preferably 1 to 5.5% by weight, and still more preferably 1 to 5% by weight, based on the total amount of tin oxide and indium oxide. By setting the amount of tin in each ITO layer to the above range, a transparent conductive film having small specific resistance and a short crystal conversion time due to heating can be formed.

When the transparent conductive layer 2 has a three-layered structure where a first indium-tin composite oxide layer, a second indium-tin composite oxide layer, and a third indium-tin composite oxide layer are laminated in this order from the side of the polymer film substrate 1, the content of tin oxide in the first indium-tin composite oxide layer is preferably 0.5% by weight to 5.5% by weight, more preferably 1 to 4% by weight, and still more preferably 2 to 4% by weight, based on the total amount of tin oxide and indium oxide. The content of tin oxide in the second indium-tin composite oxide layer is preferably 6% by weight to 15% by weight, more preferably 7 to 12% by weight, and still more preferably 8 to 12% by weight, based on the total amount of tin oxide and indium oxide. The content of tin oxide in the third indium-tin composite oxide layer is preferably 0.5% by weight to 5.5% by weight, more preferably 1 to 4% by weight, and still more preferably 2 to 4% by weight, based on the total amount of tin oxide and indium oxide. By setting the amount of tin in each ITO layer to the above range, a transparent conductive film having small specific resistance can be formed.

The transparent conductive layer 2 having a thickness of 15 nm or more and 40 nm or less, and preferably 15 nm or more and 35 nm or less can be suitably applied for touch panels.

The transparent conductive layer 2 may be crystalline or may be amorphous. In the case where an ITO film is formed as the transparent conductive layer by a sputtering method in the present embodiment, there is a restriction due to heat resistance when the substrate 1 is made of a polymer film, so that the film cannot be formed by sputtering at a high temperature. For this reason, the ITO film immediately after being formed is substantially an amorphous film (there may be a case where a portion of the film is crystallized). There may be problems that the transmittance of such an amorphous ITO film is smaller than that of a crystalline ITO film and that a change in resistance after a humidification-heating test is large. From such viewpoints, once an amorphous transparent conductive layer is formed, the amorphous transparent conductive layer may be then subjected to an annealing treatment under the presence of oxygen in the air to transform the transparent conductive layer to a crystalline film. The crystal conversion of the transparent conductive layer provides such advantages that transparency is improved, a change in resistance after a humidification-heating test is small, and humidification-heating reliability is improved. The transparent conductive layer may be a semi-crystalline film which is not completely transformed to a crystal film. When the transparent conductive layer is a semicrystalline film, the above advantages can be more easily obtained than the case where the transparent conductive layer is an amorphous film.

The matter that the transparent conductive layer 2 is a crystalline film can be determined as follows: the transparent conductive layer 2 is immersed in hydrochloric acid (concentration of 5% by weight) at 20° C. for 15 minutes, then washed with water and dried, and then interterminal resistance at an interval of about 15 mm is measured. Herein, the crystal conversion of an ITO film is considered to be completed in the case where the interterminal resistance at an interval of 15 mm is not more than 10 kΩ after the transparent conductive layer 2 is immersed in hydrochloric acid, washed with water and dried.

Although a time required for subjecting the amorphous transparent conductive layer to crystal conversion by heating is preferably a short time, a crystal conversion time tends to be increased when a film having low specific resistance is required. For example, when ITO is used as a material for forming the transparent conductive layer, the specific resistance can be largely decreased by increasing the additive amount of tin oxide (for example, 15% by weight). Thus, an increase in the dopant concentration is a means suitable for decreasing the specific resistance, while the dopant acts as impurities for a host (main component), so that it is difficult to form an ideal crystal structure by increasing the additive amount of the dopant. More energy is required for the crystallization, so that a time required for a crystal conversion treatment is increased.

A heating time for the crystal conversion of the amorphous transparent conductive layer can be appropriately set in a range of 10 minutes to 5 hours. However, when taking productivity in industrial applications into consideration, the heating time is preferably substantially 10 minutes or more and 150 minutes or less, preferably 10 minutes or more and 90 minutes or less, more preferably 10 minutes or more and 60 minutes or less, and still more preferably 10 minutes or more and 30 minutes or less. By setting the heating time to the above range, the crystal conversion can be completed while the productivity is secured.

A heating temperature for the crystal conversion of the amorphous transparent conductive layer is preferably 110° C. to 180° C., but from the viewpoint of defects (for example, precipitation of oligomer in PET film) occurring at a high temperature, the heating temperature is preferably 110° C. or higher and 150° C. or lower, and more preferably 110° C. or higher and 140° C. or lower. By setting the heating temperature to the above range, the crystal conversion of the transparent conductive layer can be completed while the defects of the film substrate are suppressed.

After the amorphous transparent conductive layer is converted into a crystalline layer by heating, the transparent conductive layer has a surface resistance value of preferably 200Ω/□ or less, more preferably 150Ω/□ or less, and still more preferably 90Ω/□ or less.

The transparent conductive layer 2 should have a low specific resistance value of $1.1 \times 10^{-4}$ Ω·cm or more and $2.8 \times 10^{-4}$ Ω·cm or less. Particularly, the specific resistance value of the transparent conductive layer after crystal conversion should fall within the above range. The specific resistance value is preferably $1.1 \times 10^{-4}$ Ω·cm or more and $2.5 \times 10^{-4}$ Ω·cm or less, more preferably $1.1 \times 10^{-4}$ Ω·cm or more and $2.4 \times 10^{-4}$ Ω·cm or less, and still more preferably $1.1 \times 10^{-4}$ Ω·cm or more and $2.2 \times 10^{-4}$ Ω·cm or less.

The transparent conductive layer 2 may be patterned by etching or the like. For example, in a transparent conductive film used for a capacitive touch panel or a matrix resistive film type touch panel, the transparent conductive layer 2 is preferably patterned in a stripe shape. When the transparent conductive layer 2 is patterned by etching, the crystal conversion of the transparent conductive layer 2 beforehand may cause difficulty in patterning by etching. For this reason, the transparent conductive layer 2 may be subjected to an annealing treatment after the transparent conductive layer 2 is patterned.

<Undercoat Layer>

An undercoat layer may be formed between the substrate 1 and the transparent conductive layer 2 in consideration of optical characteristics, electrical characteristics, mechanical characteristics or the like. The layer structure of the undercoat layer may be a single-layer structure, or may be a multi-layer structure where two or more layers are laminated.

Examples of the materials of the undercoat layer include inorganic materials such as NaF (1.3), $Na_3AlF_6$ (1.35), LiF (1.36), $MgF_2$ (1.38), $CaF_2$ (1.4), $BaF_2$ (1.3), $BaF_2$ (1.3), $SiO_2$ (1.46), $LaF_3$ (1.55), CeF (1.63), and $Al_2O_3$ (1.63), wherein each number inside the parentheses is the refractive index of each material; organic materials such as an acrylic resin, a urethane resin, a melamine resin, an alkyd resin, a siloxane polymer, and an organosilane condensate, each of which has a refractive index of about 1.4 to 1.6; and mixtures of the inorganic materials and the organic materials.

When the undercoat layer has a single-layer structure, the undercoat layer may be an inorganic undercoat layer formed of the inorganic material, or may be an organic undercoat layer formed of the organic material or a mixture of the organic material and the inorganic material. When the undercoat layer has a multi-layer structure, an inorganic undercoat layer may be laminated, an organic undercoat layer may be laminated, or an inorganic undercoat layer and an organic undercoat layer may be laminated in combination.

An organic undercoat layer 3 formed by a wet coating method (for example, gravure coating method) is preferably provided between the polymer film substrate 1 and the transparent conductive layer 2. By adopting the wet coating method, the surface roughness of the polymer film substrate 1 can be made small, and this can contribute to decrease in the specific resistance of the transparent conductive layer 2. From this viewpoint, the organic undercoat layer 3 formed on the polymer film substrate 1 has a surface roughness Ra of preferably 0.1 nm to 5 nm, more preferably 0.1 nm to 3 nm, and still more preferably 0.1 nm to 1.5 nm. The surface roughness Ra can be measured by AFM observation using a scanning type probe microscope (SPI 3800) manufactured by Seiko Instruments Inc. The surface roughness (Ra) can be measured according to 1 μm square scanning using a $Si_3N_4$ probe (spring constant: 0.09 N/m) in a contact mode.

Although the thickness of the organic undercoat layer 3 can be appropriately set in a suitable range, it is preferably 15 nm to 1500 nm, more preferably 20 nm to 1000 nm, and most preferably 20 nm to 800 nm. The surface roughness can be sufficiently suppressed by setting the thickness of the organic undercoat layer 3 to the above range, so that a high effect for decrease in specific resistance is exhibited. The organic undercoat layer 3 may be a multi-layered organic undercoat layer where two or more organic materials having a difference of 0.01 or more in refractive index are laminated, or mixtures of the inorganic material and the organic material are laminated.

An inorganic undercoat layer 4 formed by a vacuum film deposition method (for example, sputtering method or vacuum vapor-deposition method) is preferably provided between the polymer film substrate 1 and the transparent conductive layer 2. By forming the inorganic undercoat layer 4 with high density according to the vacuum film deposition method, water or an impurity gas such as an organic gas emitted from the polymer film substrate when the transparent conductive layer 2 is formed by sputtering can be suppressed. As a result, the amount of the impurity gas incorporated into the transparent conductive layer can be decreased, and this can contribute to the suppression of the specific resistance.

The thickness of the inorganic undercoat layer 3 is preferably 2 nm to 100 nm, more preferably 3 nm to 50 nm, and most preferably 4 nm to 30 nm. The emission of the impurity gas can be suppressed by setting the thickness of the inorganic undercoat layer 3 to the above range. The inorganic undercoat layer 3 may be a multi-layered inorganic undercoat layer where two or more inorganic materials having a difference of 0.01 or more in refractive index are laminated.

As shown in FIG. 1, the transparent conductive film 10 preferably includes the organic undercoat layer 3 formed on at least one surface of the polymer film 1 by the wet coating method, the inorganic undercoat layer 4 formed by the vacuum film deposition method, and the transparent conductive layer 2 in this order. By combining the organic undercoat layer with the inorganic undercoat layer, the substrate has a smooth surface and can suppress the emission of the impurity gas during sputtering, so that it is possible to effectively decrease the specific resistance of the transparent conductive layer. The thickness of each of the organic undercoat layer and the inorganic undercoat layer can be appropriately set from the above range.

Thus, by forming the undercoat layer on the surface of the polymer film substrate 1 on which the transparent conductive layer is formed, a difference in visibility between a region where the transparent conductive layer is formed and a region where the transparent conductive layer is not formed can be decreased even when the transparent conductive layer 2 is patterned into a plurality of transparent electrodes. When a film substrate is used as the transparent substrate, the undercoat layer can also act as a sealing layer which suppresses the precipitation of low molecular weight components such as an oligomer from the polymer film.

A hard coat layer, an easy adhesion layer, an anti-blocking layer and the like may be provided, if necessary, on the surface reverse to the surface of the polymer film substrate 1 on which the transparent conductive layer 2 is formed. The polymer film substrate 1 may be a substrate to which other substrates are bonded using an appropriate adhering means such as a pressure-sensitive adhesive or may be a substrate in which a protective layer such as a separator is temporarily bonded to a pressure-sensitive adhesive layer or the like for bonding the polymer film substrate 1 to other substrates.

[Method for Producing Transparent Conductive Film]

A method for producing a transparent conductive film according to the present embodiment includes a step A of placing a polymer film substrate under a vacuum condition having an ultimate vacuum degree of $3.5 \times 10^{-4}$ Pa or less, and a step B of forming a transparent conductive layer on at least one surface of the polymer film substrate by means of a sputtering method with a discharge voltage of 100 V or more and 400 V or less using a sputtering gas including argon.

Figure 2:
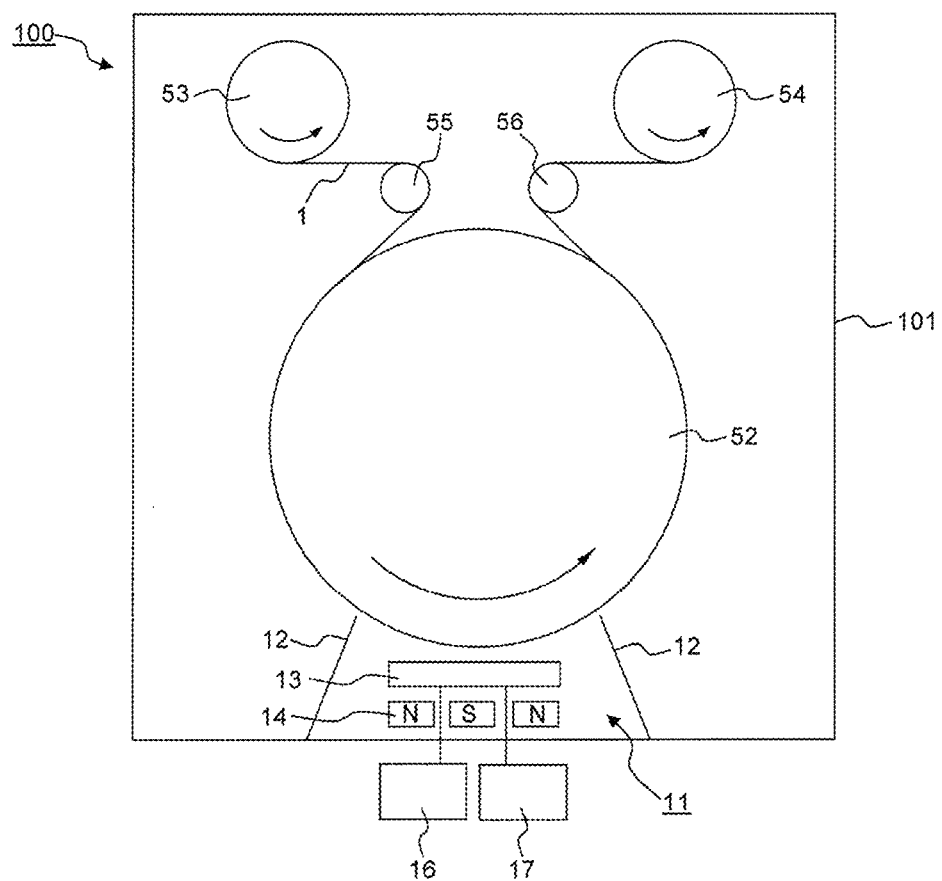
FIG. 2 is a conceptual view showing the constitution of a sputter film deposition apparatus according to one embodiment of the present invention.
Figure 3:
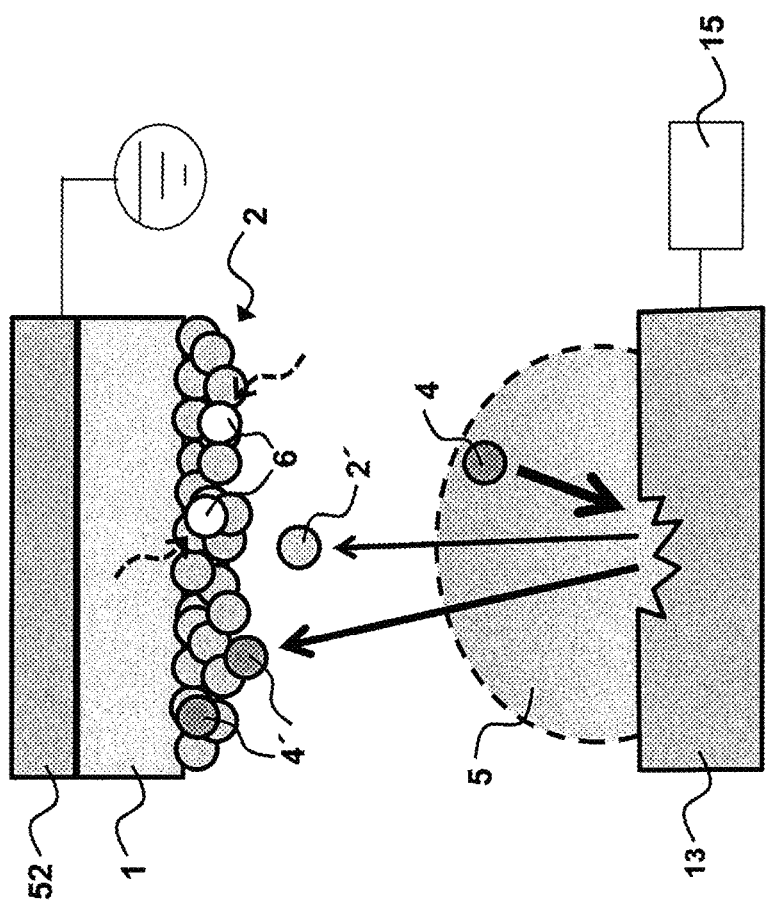
FIG. 3 is a conceptual view schematically showing a process for forming an ITO film by sputtering.

From the viewpoint of obtaining a long laminated body, the transparent conductive layer 2 is preferably formed while the substrate is transported by, for example, a roll-to-roll method. FIG. 2 is a conceptual view showing a constitution of a sputter film deposition apparatus according to one embodiment of the present invention. A sputter film deposition apparatus 100 adopts a roll-to-roll method system, in which a substrate 1 is fed from a feeding roller 53, transported by means of a temperature adjusting roller 52 through a guide roller 55, and wound by means of a take-up roller 54 through a guide roller 56. The inside of the sputter film deposition apparatus 100 is evacuated so as to have a predetermined pressure or less (evacuating means is not shown). The temperature adjusting roller 52 can be controlled so as to have a predetermined temperature.

The sputter film deposition apparatus 100 of the present embodiment includes one sputtering chamber 11. The sputtering chamber 11 is a region surrounded with a housing 101 of the sputter film deposition apparatus 100, a partition wall 12, and a temperature adjusting roller 52, and can have an independent sputtering atmosphere during sputtering film deposition. The sputtering chamber 11 includes an indium-tin composite oxide (ITO) target 13 and magnet electrodes 14 for generating a horizontal magnetic field on the target 13. The ITO target 13 is connected to a DC power source 16 and an RF power source 17, and each of the power sources provides electric discharge to form the transparent conductive layer on the substrate 1. While plasma control is performed by the DC power source 16 and the RF power source 17 in the sputtering chamber 11, and argon gas and oxygen gas as a plasma generation source are introduced at a predetermined volume ratio (for example, argon gas: oxygen gas=99:1) into the sputtering chamber 11.

The ITO target 13 may have a flat plate (planer) shape as shown in FIG. 2 or a cylindrical (rotary) shape.

A target including an indium-tin composite oxide ($In_2O_3$—$SnO_2$ target) is suitably used as the ITO target 13. When the $In_2O_3$—$SnO_2$ metal oxide target is used, the amount of tin oxide ($SnO_2$) in the metal oxide target is preferably 0.5% by weight to 15% by weight, more preferably 3 to 15% by weight, still more preferably 5 to 12% by weight, and particularly preferably 6 to 12% by weight, based on the total weight of tin oxide ($SnO_2$) and indium oxide ($In_2O_3$). If the amount of tin oxide in the target is too small, the ITO film may have poor durability. If the amount of tin oxide is too large, the ITO film is hard to crystallize, and transparency and stability of a resistance value may be insufficient.

In RF superimposed DC sputtering film deposition using such an ITO target, the sputter film deposition apparatus 100 is evacuated until the ultimate vacuum degree in the sputter film deposition apparatus 100 is preferably $3.5 \times 10^{-4}$ Pa or less, and more preferably $1.0 \times 10^{-4}$ Pa or less, and then the polymer film substrate 1 is set under a vacuum environment (step A). This can provide an atmosphere where moisture and impurities such as organic gases generated from the polymer film substrate are removed in the sputter film deposition apparatus 100. This is because the existence of moisture and organic gases terminates dangling bonds generated during sputtering film deposition to inhibit the crystal growth of a conductive oxide such as ITO, and to cause carrier scattering in the transparent conductive layer to thereby decrease the mobility.

Sputtering film deposition is performed under a reduced pressure of 1 Pa or less while oxygen gas serving as a reactive gas, or the like is introduced into the sputtering chamber 11 thus evacuated as necessary together with an inactive gas such as Ar as a sputtering gas. The discharge atmospheric pressure in the sputtering chamber 11 during the film deposition is preferably 0.09 Pa to 1 Pa, and more preferably 0.1 Pa to 0.8 Pa. If the discharge atmospheric pressure is too high, the sputtering rate tends to decrease. In contrast, when the discharge atmospheric pressure is too low, discharge may become unstable.

In the sputtering method of the present embodiment, the incorporation of the argon atoms as impurities into the transparent conductive layer 2 is suppressed by decreasing the discharge voltage. The reason is not clearly certain why the incorporation of the impurities can be suppressed by suppressing the discharge voltage, but is presumed as follows. When sputtering is performed under a high discharge voltage, the argon ions moving toward a target have high kinetic energy. As a result, it is considered that argon recoiling from the target collides with the transparent conductive layer 2 while the argon maintains high energy, so that the amount of the argon atoms incorporated into the transparent conductive layer 2 is increased.

As a result of the study of the present inventors, for example, the following method decreases the discharge voltage: a method using an RF superimposed DC power source as a power source; a method highly setting an atmospheric pressure during sputtering (discharge atmospheric pressure) within a preferable range (for example, 0.6 Pa); a method increasing the magnetic field intensity of a magnet (for example, 100 mT); and a method setting discharge output within a preferable range, or the like. The sputtering method of the present embodiment adopts the RF superimposed DC power source as the power source to decrease an effectual discharge voltage. The sputtering method of the present embodiment also generates a comparatively high horizontal magnetic field on the target 13 by the magnet electrodes 14, and confines plasma in the system in a space near the target 13 to increase a plasma density. This decreases the discharge voltage to suppress the incorporation of the argon atoms into the transparent conductive layer 2.

The kind of the power source installed in the sputtering apparatus of the present embodiment is not limited. The power source may be the RF superimposed DC power source described with reference to the drawings, a DC power source, an MF power source, an RF power source, or a combination of these power sources. From the viewpoint of an efficient decrease in the discharge voltage, the power source is preferably the RF superimposed DC power source. The discharge voltage (absolute value) is preferably 100 V or more and 400 V or less, more preferably 120 V or more and 380 V or less, more preferably 120 V or more and 300 V or less, and still more preferably 120 V or more and 250 V or less. These ranges can decrease the amount of the impurities incorporated into the transparent conductive layer 2 while the film deposition rate is secured.

The intensity of the horizontal magnetic field on the surface of the target can be set in consideration of the amount of the argon atoms to be incorporated, the film deposition speed, or the like. The intensity is preferably 20 mT or more and 200 mT or less, more preferably 60 mT or more and 150 mT or less, and still more preferably 80 mT or more and 130 mT or less.

The existence of water molecules in the film deposition atmosphere terminates dangling bonds which occur during the film deposition, and inhibits the growth of an indium-based composite oxide crystal. Therefore, the film deposition atmosphere preferably has a low water partial pressure. During the film deposition, the partial pressure of water is preferably 1.0% or less, more preferably 0.8% or less, and still more preferably 0.1% or less, based on the partial pressure of the inert gas. The sputtering apparatus is evacuated to a predetermined ultimate vacuum degree in the step A before the start of the film deposition in the present embodiment, so that the partial pressure of water during the film deposition can be set to the above range, and moisture and impurities such as organic gases generated from the substrate can be removed from the atmosphere in the apparatus.

The temperature of the film substrate when the transparent conductive layer is formed is not particularly limited. Usually, the temperature can be set to −40° C. or more and 200° C. or less.

Conventionally, it is known that when the temperature of the substrate is set to a high temperature of, for example, higher than 100° C. and 200° C. or lower, it is possible to improve the crystal conversion property of the transparent conductive film and to contribute to lowering resistance of the transparent conductive film. On the other hand, in the transparent conductive film of the present invention, the amount of impurities such as argon atoms and hydrogen atoms is set within a predetermined range. Therefore, the transparent conductive layer has less crystal conversion inhibition caused by the impurities, and can have good crystal conversion property and low specific resistance even when the transparent conductive layer is formed at a low substrate temperature of 100° C. or lower.

From the viewpoint of further improving the crystal conversion property of the transparent conductive layer, the temperature of the film substrate is, for example, higher than 100° C. and 200° C. or lower, preferably 120° C. or higher and 180° C. or lower, and more preferably 130° C. or higher and 160° C. or lower.

From the viewpoint of more easily decreasing the impurities such as hydrogen atoms and carbon atoms in the transparent conductive layer, the temperature of the film substrate is, for example, −40° C. or higher, preferably −30° C. or higher, more preferably −20° C. or higher, and still more preferably −15° C. or higher. The temperature is, for example, 80° C. or lower, preferably 40° C. or lower, preferably 30° C. or lower, still more preferably 20° C. or lower, and particularly preferably 10° C. or lower. The low temperature of the substrate can suppress the emission of the impurity gases (water, organic solvents or the like) derived from the film substrate during sputtering film deposition, and can suppress the incorporation of the impurities such as hydrogen atoms and carbon atoms into the transparent conductive layer.

The term "the temperature of the film substrate" as used in the present invention refers to the set temperature of the support on which the substrate is placed during sputtering film deposition. For example, when a roll sputtering apparatus including a film deposition drum (in the embodiment of FIG. 2, the temperature adjusting roller 52) is used to perform continuous film deposition, the temperature of the film substrate refers to the temperature of the surface of the film deposition drum on which sputtering film deposition is performed.

When sputtering film deposition is performed by a batch mode sputtering apparatus, the temperature of the film substrate refers to the temperature of the surface of a substrate holder adapted to hold the film substrate.

EXAMPLES

The present invention will be described in detail below with reference to Examples, but the invention is not limited to Examples below unless the invention departs from the gist thereof. In Examples, "part(s)" refers to "part(s) by weight" unless otherwise specified. A discharge voltage is described as an absolute value.

Example 1

(Formation of Undercoat Layer)

A thermosetting resin composition including a melamine resin, an alkyd resin, and an organosilane condensate at a solid content weight ratio of 2:2:1 was diluted with methyl ethyl ketone so that the solid content concentration was 8% by weight. The diluted composition thus obtained was applied onto one main surface of a polymer film substrate made of a 50-μm-thick PET film (trade name "Diafoil" manufactured by Mitsubishi Plastics, Inc.), and cured by heating at 150° C. for 2 minutes, to thereby form an organic undercoat layer having a film thickness of 35 nm. The organic undercoat layer thus formed had a surface roughness Ra measured by AFM ("SPI 3800" manufactured by Seiko Instruments Inc.) of 0.5 nm.

(Formation of Transparent Conductive Layer)

A polymer film substrate on which the above organic undercoat layer was formed was placed in a vacuum sputtering apparatus. The vacuum sputtering apparatus was sufficiently vacuum-evacuated so as to have an ultimate vacuum degree of $0.9 \times 10^{-4}$ Pa, to subject the film to a degassing treatment. Then, a first transparent conductor layer made of a 20-nm-thick indium-tin composite oxide layer was formed by an RF superimposed DC magnetron sputtering method (discharge voltage: 150 V, RF frequency: 13.56 MHz, ratio of RF power to DC power (RF power/DC power): 0.8), the RF superimposed DC magnetron sputtering method using a sintered body of 10% by weight of tin oxide and 90% by weight of indium oxide as a target under a vacuum atmosphere (0.40 Pa) where Ar and $O_2$ (flow ratio is Ar:$O_2$=99.9:0.1) were introduced, setting the temperature of the film substrate to 130° C., and setting a horizontal magnetic field to 100 mT. A second transparent conductor layer made of a 5-nm-thick indium-tin composite oxide layer was formed on the first transparent conductor layer by the RF superimposed DC magnetron sputtering method (discharge voltage: 150 V, RF frequency: 13.56 MHz, ratio of RF power to DC power (RF power/DC power): 0.8), the RF superimposed DC magnetron sputtering method using a sintered body of 3% by weight of tin oxide and 97% by weight of indium oxide as a target under a vacuum atmosphere (0.40 Pa) where Ar and $O_2$ (flow ratio is Ar:$O_2$=99.9: 0.1) were introduced, setting the temperature of the film substrate to 130° C., and setting a horizontal magnetic field to 100 mT. Thus, a transparent conductive layer in which the first transparent conductor layer and the second transparent conductor layer were laminated was produced. The produced transparent conductive layer was heated in a 150° C. hot-air oven to subject the transparent conductive layer to a crystal conversion treatment, thereby obtaining a transparent conductive film including a crystalline transparent conductive layer.

Example 2

A transparent conductive layer and a transparent conductive film were produced in the same manner as in Example 1 except that a 25-nm-thick transparent conductive layer was formed as a single layer using a sintered body of 10% by weight of tin oxide and 90% by weight of indium oxide as a target.

Example 3

A transparent conductive layer and a transparent conductive film were produced in the same manner as in Example 2 except that the ultimate vacuum degree in the degassing treatment of the film was set to $2.0 \times 10^{-4}$ Pa.

Example 4

A transparent conductive layer and a transparent conductive film were produced in the same manner as in Example 1 except that a 5 nm-thick $SiO_2$ layer was formed as an inorganic undercoat layer on the organic undercoat layer by means of sputtering using an MF power source.

Example 5

A transparent conductive layer and a transparent conductive film were produced in the same manner as in Example 1 except that a DC power source was used as the sputtering power source; the flow ratio of Ar and $O_2$ was set to Ar:$O_2$=99:1; and the discharge voltage was set to 235 V.

Example 6

A transparent conductive layer and a transparent conductive film were produced in the same manner as in Example 5 except that the ultimate vacuum degree in the degassing treatment of the film was set to $0.7 \times 10^{-4}$ Pa.

Example 7

A transparent conductive layer and a transparent conductive film were produced in the same manner as in Example 5 except that the ultimate vacuum degree in the degassing treatment of the film was set to $2.0 \times 10^{-4}$ Pa, and a 25-nm-thick transparent conductive layer was formed as a single layer using a sintered body of 10% by weight of tin oxide and 90% by weight of indium oxide as a target.

Example 8

A transparent conductive layer and a transparent conductive film were produced in the same manner as in Example 7 except that the ultimate vacuum degree in the degassing treatment of the film was set to $2.6 \times 10^{-4}$ Pa.

Example 9

A transparent conductive layer and a transparent conductive film were produced in the same manner as in Example 5 except that a 10 nm-thick $SiO_2$ layer was formed as an inorganic undercoat layer on the organic undercoat layer by sputtering using an MF power source.

Example 10

A transparent conductive layer and a transparent conductive film were produced in the same manner as in Example 7 except that the ultimate vacuum degree in the degassing treatment of the film was set to $0.9 \times 10^{-4}$ Pa, and a 10 nm-thick $SiO_2$ layer was formed as an inorganic undercoat layer on the organic undercoat layer by sputtering using an MF power source.

Example 11

A transparent conductive layer and a transparent conductive film were produced in the same manner as in Example 7 except that the ultimate vacuum degree in the degassing treatment of the film was set to $0.9 \times 10^{-4}$ Pa; the discharge atmospheric pressure was set to 0.60 Pa; the horizontal magnetic field was set to 30 mT; and the discharge voltage was set to 380 V.

Example 12

A transparent conductive layer and a transparent conductive film were produced in the same manner as in Example 2 except that a PET film having no organic undercoat layer formed thereon and having an Ra of 2.1 nm was used as a polymer film substrate.

Example 13

A transparent conductive layer and a transparent conductive film were produced in the same manner as in Example 5 except that the temperature of the film substrate was set to 0° C.

Example 14

A transparent conductive layer and a transparent conductive film were produced in the same manner as in Example 11 except that the temperature of the film substrate was set to 0° C., and the horizontal magnetic field was set to 100 mT.

Comparative Example 1

A transparent conductive layer and a transparent conductive film were produced in the same manner as in Example 5 except that the horizontal magnetic field was set to 30 mT, and the discharge voltage was set to 430 V.

Comparative Example 2

A transparent conductive layer and a transparent conductive film were produced in the same manner as in Example 11 except that the discharge atmospheric pressure was set to 0.25 Pa, and the discharge voltage was set to 450 V.

Comparative Example 3

A transparent conductive layer and a transparent conductive film were produced in the same manner as in Example 8 except that the ultimate vacuum degree in the degassing treatment of the film was set to $3.9 \times 10^{-4}$ Pa.

Comparative Example 4

A transparent conductive layer and a transparent conductive film were produced in the same manner as in Example 8 except that the ultimate vacuum degree in the degassing treatment of the film was set to $4.8 \times 10^{-4}$ Pa.

Comparative Example 5

A transparent conductive layer and a transparent conductive film were produced in the same manner as in Example 5 except that the ultimate vacuum degree in the degassing treatment of the film was set to $4.8 \times 10^{-4}$ Pa, and the argon gas was then passed through water (25° C.) in a water storage tank installed outside the sputtering apparatus, followed by introducing the argon gas into the sputtering apparatus; the discharge atmospheric pressure was set to 0.20 Pa; and the discharge voltage was set to 270 V.

<Evaluation>

Measurements and valuation methods for the transparent conductive films produced in Examples and Comparative Examples are as follows. The evaluation results are shown in Table 1.

(1) Evaluation of Film Thickness

The X-ray reflectivity of the ITO film was measured under the following measurement conditions using a powder X-ray diffractometer ("RINT-2000" manufactured by Rigaku Corporation) with an X-ray reflectivity method as a measurement principle. The measurement data obtained was analyzed with analysis software ("GXRR3" manufactured by Rigaku Corporation) to calculate the film thickness of the ITO film. The analysis conditions were as follows: a two-layer model including a film substrate and an ITO thin film having a density of 7.1 g/cm$^3$ was adopted, and minimum square fitting was performed with the film thickness and surface roughness of the ITO film as variables, so that the film thickness of the ITO film was analyzed.

<Measurement Conditions>

Light source: Cu—Kα radiation (wavelength: 1.5418 angstroms), 40 kV, 40 mA
Optical system: parallel beam optical system
Divergence slit: 0.05 mm
Receiving slit: 0.05 mm
Monochromation and parallelization: using a multilayer Goebel mirror
Measurement mode: θ/2θ scan mode
Measurement range (2θ): 0.3 to 2.0 degrees <Analysis Conditions>

Analysis technique: minimum square fitting Analysis range (2θ): 2θ=0.3 to 2.0 degrees (2) Quantitative Measurement of Argon Atoms The existing atomic amount of Ar in the ITO film was analyzed under the following conditions using a measuring apparatus ("Pelletron 3SDH" manufactured by National Electrostatics Corporation) with a Rutherford backscattering spectroscopic method as a measurement principle. Specifically, four elements (In, Sn, O, and Ar) were used as detection targets, and the ratio (atomic %) of the existing atomic amount of Ar to the total existing atomic amount of the four elements was measured.

<Measurement Conditions>

Figure 4:
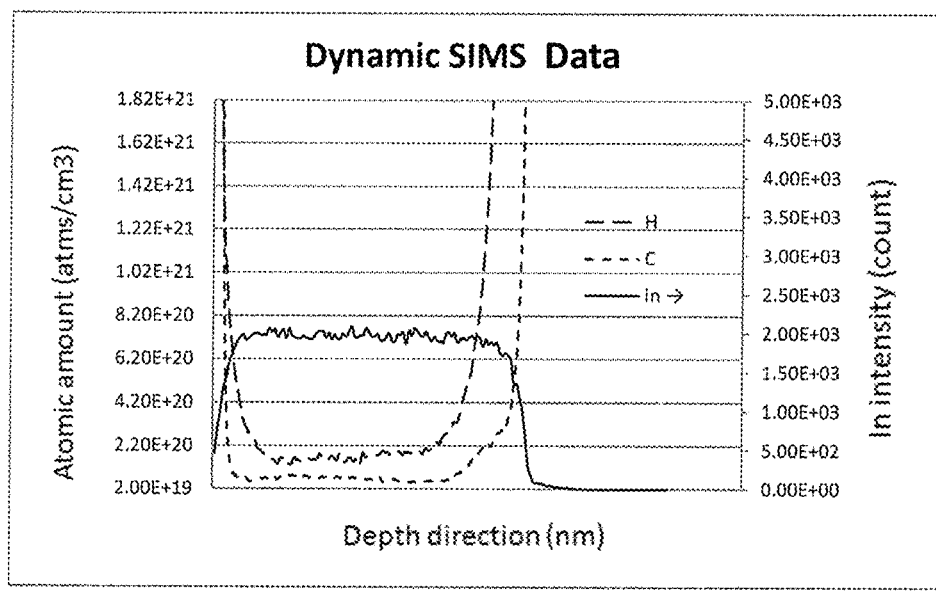
FIG. 4 is a depth profile of hydrogen atoms and carbon atoms detected by dynamic SIMS measurement.

Incident ion: $^4$He$^{++}$
Incident energy: 2300 keV
Incident angle: 0 deg
Scattering angle: 110 deg
Sample current: 10 nA
Beam diameter: 2 mmφ
In-plane rotation: none
Irradiation amount: 176 μC (3) Quantitative Measurement of Hydrogen Atoms and Carbon Atoms The existing amount (atoms/cm$^3$) of each of the carbon atoms and hydrogen atoms in a depth direction was measured at a 0.15-nm pitch using an apparatus (apparatus: PHI ADEPT-1010 manufactured by ULVAC-PHI, Incorporated) with dynamic SIMS as a measurement principle. FIG. 4 shows the depth profiles of the hydrogen atoms and carbon atoms detected in the present measurement. In FIG. 4, a left end represents a surface side, and a right end represents a substrate side. The right termination part of the In peak is a terminal of the ITO film in the depth direction. The present measurement performs detection including the hydrogen atoms and carbon atoms included in the surface contamination components and the film on the surface side and film substrate side of the transparent conductive layer shown in FIG. 4.

Therefore herein, the amount of each of the hydrogen atoms and carbon atoms, which was detected substantially at the center point of the film thickness of the transparent conductive layer and which was not influenced by the hydrogen atoms and carbon atoms included in the contamination components and the film substrate, was defined as the existing atomic amount of each of the hydrogen atoms and carbon atoms of the ITO film thickness.

A method for determining the center point above is as follows. As described above, in FIG. 4, the left end represents the surface side, and the right end represents the substrate side. The right termination part of the In peak represents the terminal of the ITO film in the depth direction. Positions in which In detection intensity was decreased by half based on peak intensity on the surface side and the substrate side were defined as the outermost surface part and deepest part of the ITO layer. The intermediate point of the outermost surface part and deepest part was defined as the center point of the ITO film thickness.

(4) Measurement of Specific Resistance of Crystalline ITO Layer

The transparent conductive film was heat-treated at 150° C. to subject the transparent conductive layer to crystal conversion, and the surface resistance (Ω/□) of the transparent conductive layer was then measured by a four probe method according to JIS K7194 (1994). The specific resistance was calculated from the thickness of the transparent conductive layer obtained by the above (1) measurement of film thickness, and the surface resistance.

(5) Evaluation of Crystallization

The transparent conductive film in which the ITO film was formed on the polymer film substrate was heated in a 150° C. hot wind oven, to subject the transparent conductive film to a crystal conversion treatment. The transparent conductive film was immersed in hydrochloric acid having a concentration of 5% by weight at 20° C. for 15 minutes, and then washed with water and dried. Interterminal resistance at an interval of 15 mm was measured using a tester. Herein, the crystal conversion of the ITO film was considered to be completed in the case where the interterminal resistance at an interval of 15 mm was not more than 10 kΩ after the film was immersed in hydrochloric acid, washed with water and dried. The measurement was carried out at every heating time of 30 minutes, and the time at which the completion of crystallization could be confirmed was evaluated as a crystal conversion time.

TABLE 1

| | Ultimate vacuum degree [×10$^{-4}$ Pa] | Horizontal magnetic field [mT] | Discharge voltage [V] | Discharge atmospheric pressure [Pa] | Constitution of ITO layer | ITO film thickness (total) [nm] | Thickness of organic undercoat layer [nm] | Thickness of inorganic undercoat layer [nm] | Existing atomic amount of Ar atoms [atomic %] | Existing atomic amount of H atoms [×10$^{20}$ atms/cm$^3$] | Existing atomic amount of C atoms [×10$^{20}$ atms/cm$^3$] | Specific resistance [×10$^{-4}$ Ω·cm] | Crystal conversion time [min] |
|---|---|---|---|---|---|---|---|---|---|---|---|---|---|
| Example 1 | 0.9 | 100 | 150 | 0.40 | Two layers | 25 | 35 | — | 0.07 | 3.9 | 3.1 | 1.6 | 90 |
| Example 2 | 0.9 | 100 | 150 | 0.40 | One layer | 25 | 35 | — | 0.07 | 3.9 | 3.0 | 1.7 | 90 |
| Example 3 | 2.0 | 100 | 150 | 0.40 | One layer | 25 | 35 | — | 0.07 | 8.7 | 6.3 | 1.9 | 120 |
| Example 4 | 0.9 | 100 | 150 | 0.40 | Two layers | 25 | 35 | 5 | 0.07 | 1.1 | 0.8 | 1.4 | 60 |
| Example 5 | 0.9 | 100 | 235 | 0.40 | Two layers | 25 | 35 | — | 0.14 | 3.9 | 3.1 | 2.3 | 60 |
| Example 6 | 0.7 | 100 | 235 | 0.40 | Two layers | 25 | 35 | — | 0.14 | 2.2 | 2.3 | 2.2 | 60 |
| Example 7 | 2.0 | 100 | 235 | 0.40 | One layer | 25 | 35 | — | 0.14 | 9.2 | 8.1 | 2.4 | 90 |
| Example 8 | 2.6 | 100 | 235 | 0.40 | One layer | 25 | 35 | — | 0.14 | 11.4 | 9.8 | 2.5 | 90 |
| Example 9 | 0.9 | 100 | 235 | 0.40 | Two layers | 25 | 35 | 10 | 0.14 | 0.8 | 0.2 | 2.0 | 30 |
| Example 10 | 0.9 | 100 | 235 | 0.40 | One layer | 25 | 35 | 10 | 0.14 | 0.8 | 0.2 | 2.1 | 60 |
| Example 11 | 0.9 | 30 | 380 | 0.60 | One layer | 25 | 35 | — | 0.22 | 3.8 | 3.2 | 2.8 | 60 |
| Example 12 | 0.9 | 100 | 150 | 0.40 | One layer | 25 | — | — | 0.07 | 3.8 | 3.1 | 1.9 | 120 |
| Example 13 | 0.9 | 100 | 235 | 0.40 | Two layers | 25 | 35 | — | 0.14 | 2.1 | 1.9 | 2.2 | 60 |
| Example 14 | 0.9 | 100 | 380 | 0.60 | One layer | 25 | 35 | — | 0.22 | 2.0 | 1.8 | 2.6 | 60 |
| Comparative Example 1 | 0.9 | 30 | 430 | 0.40 | Two layers | 25 | 35 | — | 0.25 | 3.9 | 3.1 | 3.2 | 60 |
| Comparative Example 2 | 0.9 | 30 | 450 | 0.25 | One layer | 25 | 35 | — | 0.26 | 3.9 | 3.1 | 3.4 | 120 |
| Comparative Example 3 | 3.9 | 100 | 235 | 0.40 | One layer | 25 | 35 | — | 0.14 | 14.9 | 11.0 | 2.9 | 240 |
| Comparative Example 4 | 4.8 | 100 | 235 | 0.40 | One layer | 25 | 35 | — | 0.14 | 17.1 | 13.1 | 7.5 | Not crystallized |
| Comparative Example 5 | 4.8 | 100 | 270 | 0.20 | One layer | 25 | 35 | — | 0.16 | 19.2 | 12.9 | 7.8 | Not crystallized |

(Results and Discussion)

In Examples 1 to 14, it is found that the existing atomic amount of each of the argon atoms, hydrogen atoms, and carbon atoms in the transparent conductive layer was decreased to a predetermined range or less; the specific resistance of the transparent conductive layer after crystal conversion was also a low value of 2.8×10$^{-4}$ Ω·cm or less; and the low resistance of the transparent conductive layer was achieved. On the other hand, in both Comparative Examples 1 and 2, the existing atomic concentration of the argon atoms in the transparent conductive layer was more than 0.24 atomic %, and the specific resistance of the transparent conductive layer was also a high value of more than 2.8×10$^{-4}$ Ω·cm. In Comparative Example 3, the existing atomic amount of the argon atoms was low, but the existing atomic amount of the hydrogen atoms was more than 13×10$^{20}$ atoms/cm$^3$, so that the specific resistance was high. The time required for the crystal conversion was also increased by the crystal growth inhibitory effect of the hydrogen atoms. In Comparative Examples 4 and 5, since the existing atomic amount of each of the hydrogen atoms and carbon atoms was too high, the ITO film was not crystallized, so that the specific resistance was high.

DESCRIPTION OF REFERENCE SIGNS

1: substrate
2: transparent conductive layer
10: transparent conductive film
11: sputtering chamber
13: target
14: magnet electrode
16: DC power source
17: RF electrode
100: sputter film deposition apparatus

The invention claimed is:
1. A transparent conductive film comprising:
a polymer film substrate; and
a transparent conductive layer formed on at least one surface of the polymer film substrate by a sputtering method using a sputtering gas including argon,
wherein:

an existing atomic amount of argon atoms in the transparent conductive layer is more than 0.05 atomic % and 0.24 atomic % or less;

an existing atomic amount of hydrogen atoms in the transparent conductive layer is more than $0.001 \times 10^{20}$ atoms/cm$^3$ and $13 \times 10^{20}$ atoms/cm$^3$ or less; and the transparent conductive layer has a specific resistance of $1.1 \times 10^{-4}$ Ω·cm or more and $2.8 \times 10^{-4}$ Ω·cm or less.

2. The transparent conductive film according to claim 1, wherein an existing atomic amount of carbon atoms in the transparent conductive layer is up to $10.5 \times 10^{20}$ atoms/cm$^3$.

3. The transparent conductive film according to claim 1, wherein the transparent conductive layer is an indium-tin composite oxide layer.

4. The transparent conductive film according to claim 1, wherein the transparent conductive layer is crystalline.

5. The transparent conductive film according to claim 3, wherein a content of tin oxide in the indium-tin composite oxide layer is 0.5% by weight to 15% by weight based on a total amount of tin oxide and indium oxide.

6. The transparent conductive film according to claim 1, wherein:

the transparent conductive layer has a structure where a plurality of indium-tin composite oxide layers are laminated; and at least two layers of the plurality of indium-tin composite oxide layers have existing atomic amounts of tin different from each other.

7. The transparent conductive film according to claim 6, wherein all of the indium-tin composite oxide layers are crystalline.

8. The transparent conductive film according to claim 6, wherein:

the transparent conductive layer includes a first indium-tin composite oxide layer and a second indium-tin composite oxide layer in this order from a side of the polymer film substrate;

a content of tin oxide in the first indium-tin composite oxide layer is 6% by weight to 15% by weight based on a total amount of tin oxide and indium oxide in the first indium-tin composite oxide layer; and a content of tin oxide in the second indium-tin composite oxide layer is 0.5% by weight to 5.5% by weight based on the total amount of tin oxide and indium oxide in the second indium-tin composite oxide layer.

9. The transparent conductive film according to claim 1, comprising an organic undercoat layer formed by a wet coating method between the polymer film substrate and the transparent conductive layer.

10. The transparent conductive film according to claim 1, comprising an inorganic undercoat layer formed by means of a vacuum film deposition method between the polymer film substrate and the transparent conductive layer.

11. The transparent conductive film according to claim 1, comprising:

an organic undercoat layer formed by means of a wet coating method, an inorganic undercoat layer formed by means of a vacuum film deposition method, and the transparent conductive layer in this order on at least one surface of the polymer film.

12. A method for producing the transparent conductive film according to claim 1, the method comprising:

a step A of placing a polymer film substrate under a vacuum condition having an ultimate vacuum degree of $3.5 \times 10^{-4}$ Pa or less; and a step B of forming a transparent conductive layer on at least one surface of the polymer film substrate by means of a sputtering method with a discharge voltage of 100 V or more and 400 V or less using a sputtering gas including argon.

13. The method according to claim 12, wherein the sputtering method is an RF superimposed DC sputtering method.

14. The method according to claim 12, wherein a horizontal magnetic field at a surface of a sputtering target is 20 mT or more and 200 mT or less in the step B.

15. The method according to claim 12, comprising a step of heating the transparent conductive layer to subject the transparent conductive layer to crystal conversion.

16. The method according to claim 12, comprising a step of forming, before the step B, an inorganic undercoat layer by means of a vacuum film deposition method on a surface of the polymer film substrate on which the transparent conductive layer is formed.

17. The transparent conductive film according to claim 1, wherein the existing atomic amount of carbon atoms in the transparent conductive layer is $0.001 \times 10^{20}$ atoms/cm$^3$ to $10.5 \times 10^{20}$ atoms/cm$^3$.

\* \* \* \* \*